United States Patent
Fredette

(10) Patent No.: US 8,358,136 B2
(45) Date of Patent: Jan. 22, 2013

(54) STATE OF CHARGE CALCULATOR FOR MULTI-CELL ENERGY STORAGE SYSTEM HAVING CELL BALANCING

(75) Inventor: Steven J. Fredette, South Windsor, CT (US)

(73) Assignee: UTC Power Corporation, South Windsor, CT (US)

( * ) Notice: Subject to any disclaimer, the term of this patent is extended or adjusted under 35 U.S.C. 154(b) by 507 days.

(21) Appl. No.: 12/733,435

(22) PCT Filed: Sep. 20, 2007

(86) PCT No.: PCT/US2007/020400
§ 371 (c)(1),
(2), (4) Date: Mar. 1, 2010

(87) PCT Pub. No.: WO2009/038564
PCT Pub. Date: Mar. 26, 2009

(65) Prior Publication Data
US 2010/0171503 A1  Jul. 8, 2010

(51) Int. Cl.
*G01N 27/416* (2006.01)
(52) U.S. Cl. .................. 324/434; 320/118; 320/132
(58) Field of Classification Search .......... None
See application file for complete search history.

(56) References Cited

U.S. PATENT DOCUMENTS

| | | | |
|---|---|---|---|
| 5,578,915 A | 11/1996 | Crouch, Jr. et al. ............. 320/48 |
| 5,739,670 A | 4/1998 | Brost et al. ...................... 320/14 |
| 6,522,148 B2 | 2/2003 | Ochiai et al. .................... 324/48 |
| 6,845,332 B2 | 1/2005 | Teruo .............................. 702/63 |
| 6,873,134 B2 | 3/2005 | Canter et al. .................. 320/118 |
| 6,876,175 B2 | 4/2005 | Schoch .......................... 320/132 |
| 7,245,108 B2 | 7/2007 | Chertok et al. ................ 320/132 |
| 7,250,741 B2 | 7/2007 | Koo et al. ...................... 320/132 |
| 7,378,818 B2 * | 5/2008 | Fowler et al. ................. 320/119 |
| 2006/0232277 A1* | 10/2006 | Murakami et al. ............ 324/433 |
| 2008/0157718 A1* | 7/2008 | Ohnuki ......................... 320/134 |

\* cited by examiner

*Primary Examiner* — Edward Tso
*Assistant Examiner* — Robert Grant
(74) *Attorney, Agent, or Firm* — Stephen A. Schneeberger

(57) ABSTRACT

An arrangement for monitoring the current or state of charge (SOC) of an energy system (230) having one or more series-connected strings ($S_1, S_2, \ldots S_n$) of battery cells ($C_1, C_2, \ldots C_n$). The battery cells each have respective dissipative devices ($D_1, D_2, \ldots D_n$) selectively connectable in parallel therewith for balancing cell voltages in the string. The dissipative devices are of predetermined, typically equal, impedance value. The voltage across each cell ($V_{c1}, V_{c2}, \ldots V_{cn}$) may be separately monitored, such that by dividing the monitored voltage across a cell by the impedance value of a dissipative device connected in parallel therewith, the dissipative current is determined. A summation of all of the dissipative currents yields an error value, which error value is then removed from the measured gross current ($I_{bat}$) flowing through the combined battery cells and dissipative devices to yield a corrected value of current ($I_{batnet}$). A corrected SOC value ($Q_{net}$) is obtainable in a similar manner.

7 Claims, 4 Drawing Sheets

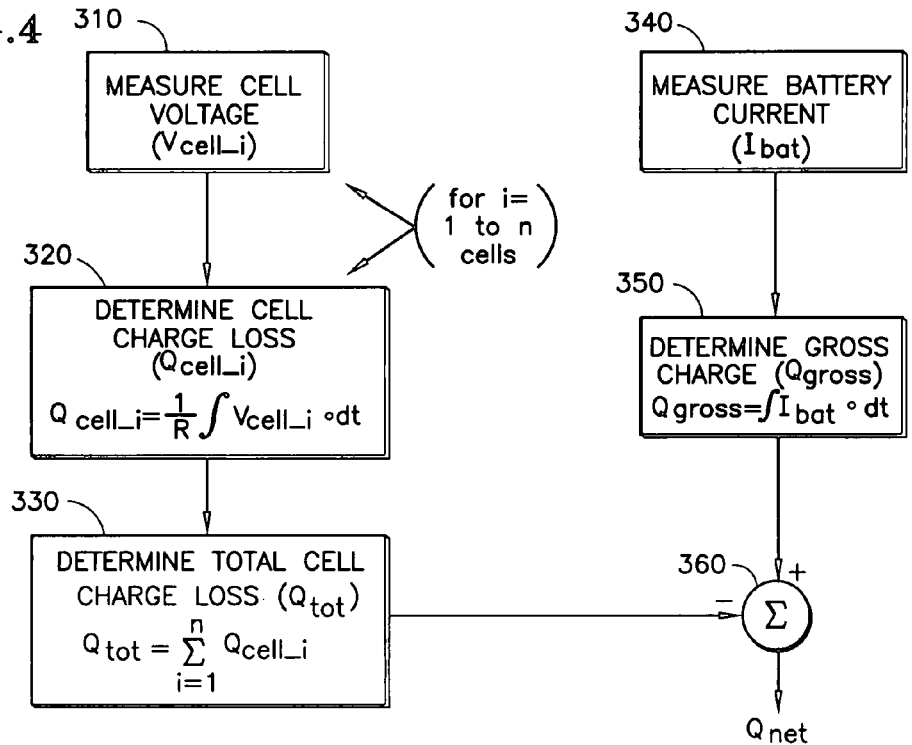
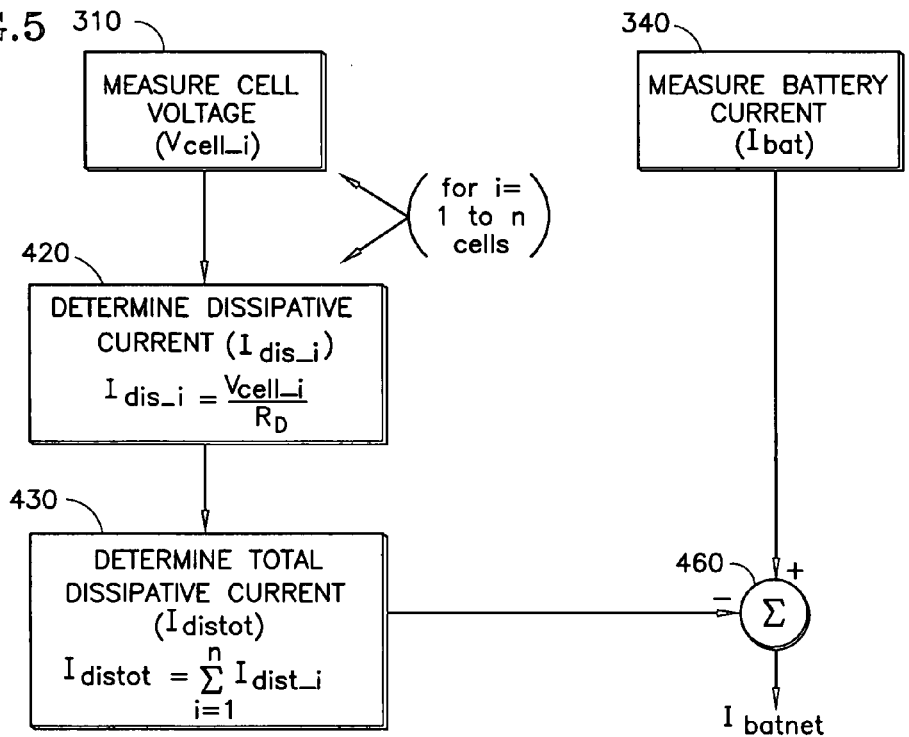

US 8,358,136 B2

STATE OF CHARGE CALCULATOR FOR MULTI-CELL ENERGY STORAGE SYSTEM HAVING CELL BALANCING

This invention was made with U.S. Government support under Contract FA8650-06-2-2601 awarded by the U.S. Air Force. The U.S. Government has certain rights in this invention.

TECHNICAL FIELD

This disclosure relates to electrical energy storage systems and more particularly to multi-cell energy storage systems having cell balancing. More particularly still, the disclosure relates to state of charge calculation for a multi-cell electrical energy storage system having cell balancing.

BACKGROUND ART

Electrical energy storage systems, or simply energy storage systems, such as batteries and the like, find application in numerous different uses. Examples include power back-up devices for computers and the like, energy storage batteries for automotive applications including power for electric drive motors, energy storage systems to facilitate transient responses by fuel cells and the like, amongst others.

Most such energy storage systems are capable of not only supplying an electrical current to a load, but of also being recharged from another source of current. In keeping with both the processes of discharging and of charging the energy storage system, it is convenient or even necessary to monitor the state of charge (SOC) of the energy storage system. By knowing and/or tracking the SOC of an energy storage system, it is possible to determine energy reserve and whether or not to add further charge to the storage system.

Various means and techniques exist for determining and/or monitoring the SOC of such systems. Implicit in the following description is the separate ability, not described herein, to accurately establish at least an initial SOC level, with the focus of the disclosure being on the accurate tracking of that SOC as the energy storage device is discharged by supplying current to a load or is charged by receiving current from a source. Knowledge and/or control of the SOC of the energy storage system is useful and necessary to assure that it is neither too low to provide the requisite power to the load during up transients nor too high to receive a charge current from the load during down transients. For example, it may be desirable to operate around a nominal SOC range of 60%-80% charge, thus allowing for further charge or discharge during transients.

FIG. 1 illustrates one embodiment of a simple arrangement in accordance with the prior art for monitoring the SOC of an energy storage system used in conjunction with a fuel cell. A fuel cell 10 generates DC electrical power to supply a load 20. The fuel cell 10 is connected to the load 20 via a DC to DC converter 22 which acts as a voltage regulator. In order to assure the maintenance of a uniform and sufficient supply of power to the load 20, particularly during periods of transients occasioned by changes in the electrical load, it is desirable to supplement the slower responding fuel cell 10 with an energy storage system here depicted as rechargeable battery 30. The battery 30 in the illustrated example nominally provides a voltage of about 28 $V_{dc}$, and thus is comprised of a string $S_1$ of multiple series-connected battery cells $C_1, C_2, \ldots C_n$, each having a lesser voltage of perhaps 3 $V_{dc}$. Other voltage levels are possible depending on the application, and include, for example, 400 $V_{dc}$ and 700 $V_{dc}$. Moreover, to provide the requisite current/power capacity to supplement the fuel cell 10 during transients, etc., there may typically be multiple series-connected strings $S_1, S_2, \ldots S_n$ of battery cells mutually connected in parallel. For further reference and distinction, as used herein, the fuel cell will be termed "fuel cell", whereas the individual cells which collectively make up the battery or energy storage device are termed either "battery cells" or simply "cells".

Given only the foregoing configuration of battery 30, it has been, a relatively simple matter to monitor the SOC of that battery via the measurement of discharge and charging currents $I_{bat}$ respectively leaving and entering the battery via a current sensor or monitor 36. The current sensor 36 is connected in series with the battery 30 and is capable of determining not only magnitude of current $I_{bat}$, but also its directional sense, i.e., charging vs discharging. Given this singular parameter of current, either charging or discharging, and assuming the initial determination of an accurate level of SOC, it is then possible through algorithms of varying complexity to establish the SOC in a continuous and on-going basis. In the simplest sense, charge Q is the integral of current I and time t, i.e., $Q = \int I \cdot dt$. This is a conventional amp hour integration technique, with the current I having either a positive or negative sense (value) depending on whether the battery is being discharged or charged. Further examples of this may be seen in U.S. Pat. Nos. 5,578,915 and 5,739,670.

While FIG. 1 represents a simplified embodiment of the prior art, perhaps a more typical arrangement is one in which provision is included for balancing the voltage of the individual cells in a series string of battery cells. This requirement arises because as multiple cells are added in series, although the current through each cell is the same, the qualities or "health" of each cell differ and the voltage across each cell may tend to vary by as much as 0.1V to 0.5V or more, with a nominal voltage being about 3.0V as noted earlier. Other nominal cell voltages can be utilized and are within the intent and scope of the disclosure. In such instance, the healthy cell(s) can be stressed by "carrying" the less healthy cells. Thus, it is desirable that each of the cells be operating at nearly the same voltage, and this is accomplished by the known technique of cell balancing depicted in FIG. 2 in accordance with the prior art.

Referring to FIG. 2, reference numbers identical to those of FIG. 1 are used in FIG. 2 for those components that are the same, or substantially the same, in the two configurations. However, where there is some functional, compositional, or structural difference occasioned by the disclosure, but the components of FIG. 2 nevertheless remain analogous to components in FIG. 1, they have been given the same reference number, but preceded by a "1". This brief description emphasizes the difference in character, structure, and/or function of the FIG. 2 embodiment of the prior art, and minimizes repetition of description that is duplicative of that provided with respect to FIG. 1.

The battery 130 of FIG. 2 is similar to battery 30 of FIG. 1, but further includes a dissipative device, such as a resistor $D_1$, $D_2, \ldots D_n$, associated and connectable in parallel with each of the respective battery cells $C_1, C_2 \ldots C_n$ via respective selectively actuable switches $SW_1, SW_2 \ldots SW_n$. Control circuitry (not shown in FIG. 2) includes the capability of sensing the voltage across each of the cells $C_1, C_2 \ldots C_n$ in each of the series strings $S_1 \ldots S_n$, as via one or more high impedance amplifiers or the like, and further includes the capability of selectively closing (or opening) individual switches $SW_1$, $SW_2 \ldots SW_n$ as required. More specifically, each dissipative device $D_1, D_2, \ldots D_n$ is of equal resistive or impedance value for convenience, and thus makes a coarse, but acceptable, downward adjustment in the voltage of a particular cell when connected in parallel therewith via closure of its respective switch, and vice versa upon opening the switch. By selective actuation of the dissipative devices associated with particular ones of the battery cells, it is possible to maintain the voltage across each of the cells at a more nearly constant value, thereby extending the life of the battery 130. Examples of similar cell-balancing arrangements are disclosed in U.S. Pat. Nos. 6,873,134 and 7,245,108.

While the cell-balancing arrangement of FIG. 2 affords the advantage of maintaining the many cells of the battery 130 at nearly the same voltage, it introduces a complication to the accurate monitoring or calculation of the SOC of the battery. Whereas with respect to the embodiment of FIG. 1 the SOC Q could be monitored simply by tracking the flow of charging and discharging current, $I_{bat}$, over time, it will now be appreciated that some of the $I_{bat}$ current flowing through the single current sensor 36 is, to the extent a respective switch is closed, flowing through one or more of the various dissipative devices $D_1, D_2, \ldots D_n$ connected in parallel with its respective cell. For this reason, it is no longer possible to accurately monitor the SOC of the battery 130 simply by monitoring the current $I_{bat}$ flowing through current sensor 36 because some of that current is no longer associated with charging or discharging the cells, but is flowing through the dissipative devices.

What is needed is an arrangement for accurately monitoring or measuring the SOC of an energy storage system, such as a battery, wherein the battery is comprised of one or more series-connected strings of cell, and the cells are each provided with respective dissipative devices for balancing cell voltages in the string.

SUMMARY

The present disclosure provides an arrangement for monitoring or measuring, with relatively greater accuracy than the prior art, the SOC of an energy storage system, such as a battery, wherein the battery is comprised of one or more series-connected strings of cells, and the cells are each provided with respective dissipative devices selectively connectable in parallel therewith for balancing cell voltages in the string.

The dissipative devices, typically resistors, are each of a known resistance or impedance, and typically of equal value. Moreover, capability exists to sense or monitor the voltage across each cell. Accordingly, given the voltage sensed across a cell when a dissipative device is connected in parallel therewith, and further knowing the resistance/impedance of that dissipative device, it is possible to determine from Ohm's Law the current through that dissipative device. Assuming this determination of current, $I_{dis\_1}$, is and can be made with respect to each of the dissipative devices that are actually connected in parallel with respective cells, a summation of those currents, $I_{distot}$, serves to represent the error which they introduce to the $I_{bat}$ measured by current sensor 36 as a measure of the current I in determining SOC to be $Q=\int I \cdot dt$. Accordingly, the $I_{bat}$ current is then corrected by subtracting that summed error value, $I_{distot}$, and the corrected $I_{batnet}$ may then serve as the value of I in the determination of the SOC, Q, or any other similar use in which a net, or corrected, value of current I is required. This correction or compensation of the signal represented by the measured $I_{bat}$ current then allows a more accurate determination of SOC than was afforded by prior systems having cell balancing.

Whereas the foregoing characterization was expressed solely in the context of correcting $I_{bat}$ for possible subsequent use of that corrected value in the determination of an accurate SOC or the like, it is also possible to perform similar operations mostly in a charge or SOC domain, Q, such that the result is $Q_{net}$, a corrected value of Q. In such instance, whereas the sensing or monitoring of battery cell voltages and the sensing or monitoring of the cumulative current $I_{bat}$ is the same as above, a time integral of the cell voltage is divided by the known impedance/resistance to yield $Q_{cell}$ as the dissipative charge component for a particular cell having the balancing impedance connected in parallel. Then the $Q_{cell}$ values are summed for the several such cells with connected impedance to provide the total dissipative charge $Q_{tot}$ for the several cells. A similar determination of the gross charge in the system, $Q_{gross}$, is obtained by taking the time integral of the measured battery current $I_{bat}$. Then a corrected value of charge, $Q_{net}$, is obtained by removing the total dissipative charge $Q_{tot}$ from the gross charge in the system, $Q_{gross}$, as by summation, to yield $Q_{net}$.

The foregoing process of correcting the cumulative value of current, $I_{bat}$, to yield a corrected value $I_{batnet}$, or of correcting a measured and computed gross charge, $Q_{gross}$, to yield a corrected charge, $Q_{net}$, is conveniently practiced with appropriate circuitry, such as suitably programmed processor/controller circuitry.

The foregoing features and advantages of the present disclosure will become more apparent in light of the following detailed description of exemplary embodiments thereof as illustrated in the accompanying drawings.

BRIEF DESCRIPTION OF DRAWINGS

FIG. 4 illustrates a flow chart representative of program steps executed by the arrangement of FIG. 3 for providing values of $I_{bat}$ current and/or SOC corrected, or compensated, for dissipative current; and FIG. 5 illustrates a flow chart similar to that of FIG. 4, but simplified to initially provide a corrected $I_{bat}$ for the subsequent determination of a correct SOC.

DETAILED DESCRIPTION

Reference was made above in the Background Art section to two embodiments present in the prior art for providing a signal indicative of current flowing into or out of an energy storage system, or battery, for use in determining/monitoring the state of charge (SOC) of that battery. Both embodiments were depicted in use in conjunction with a fuel cell. The embodiment of FIG. 1 depicts the simpler situation of a series string of battery cells without cell balancing, and FIG. 2 depicts the more complex situation that includes cell balancing with its attendant benefits but also limitations with respect to determining/monitoring the SOC of the battery.

Figure 1:
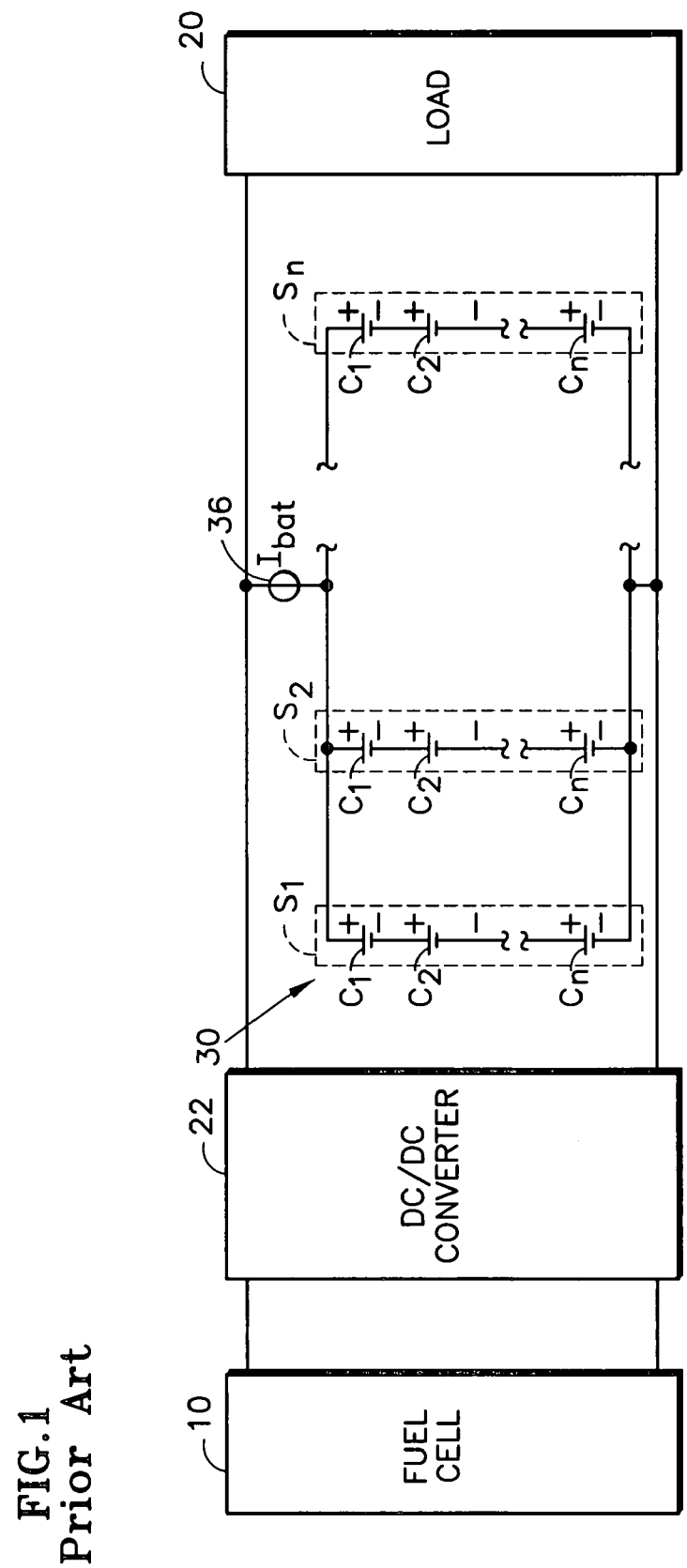
FIG. 1 is a diagram illustrating a simple embodiment of an arrangement in accordance with the prior art for monitoring the SOC of a multi-celled energy storage system used in conjunction with a fuel cell.
Figure 2:
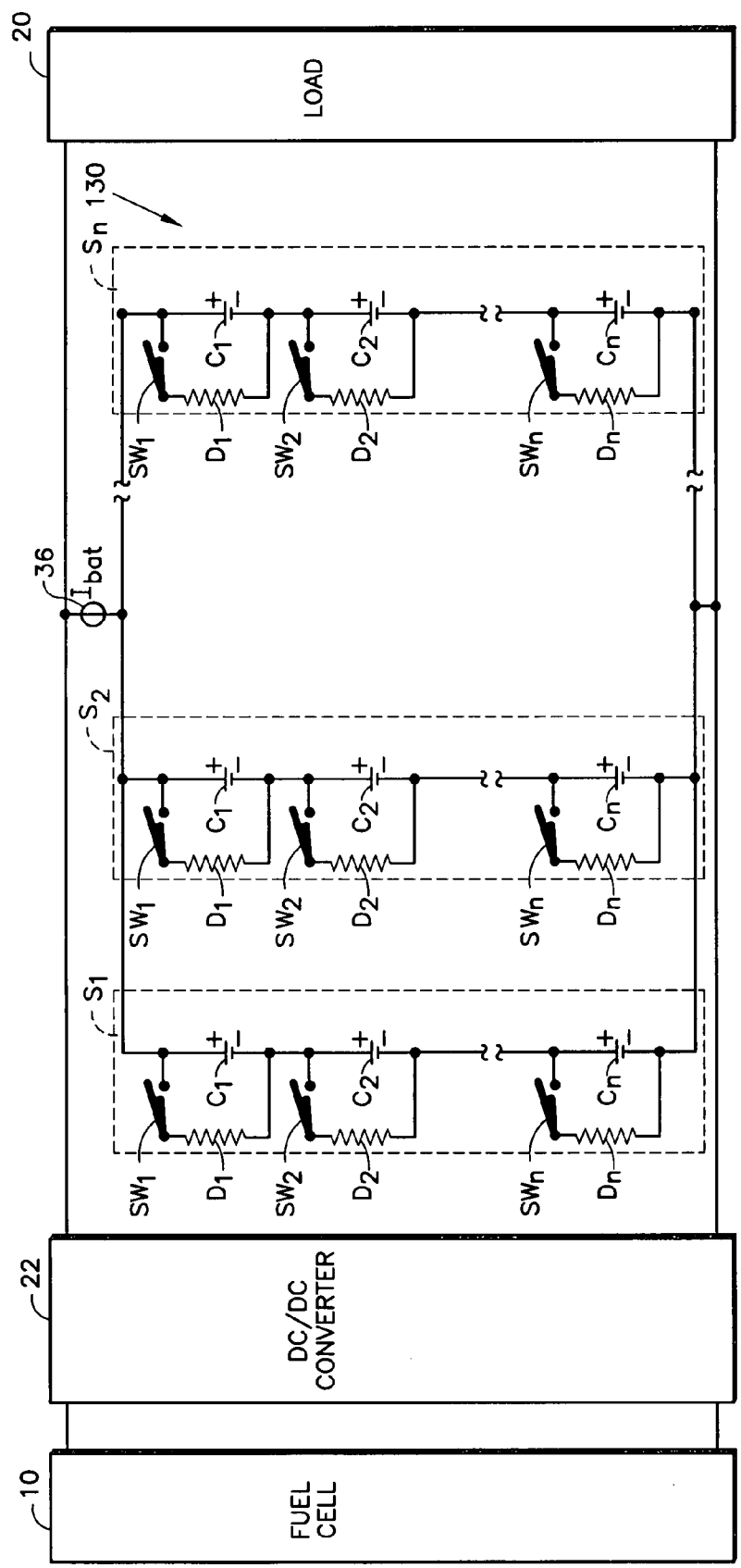
FIG. 2 is a diagram illustrating a simple embodiment of an arrangement in accordance with the prior art for monitoring the SOC of a multi-celled energy storage system having cell-balancing capability and used in conjunction with a fuel cell.
Figures 3, 3A:
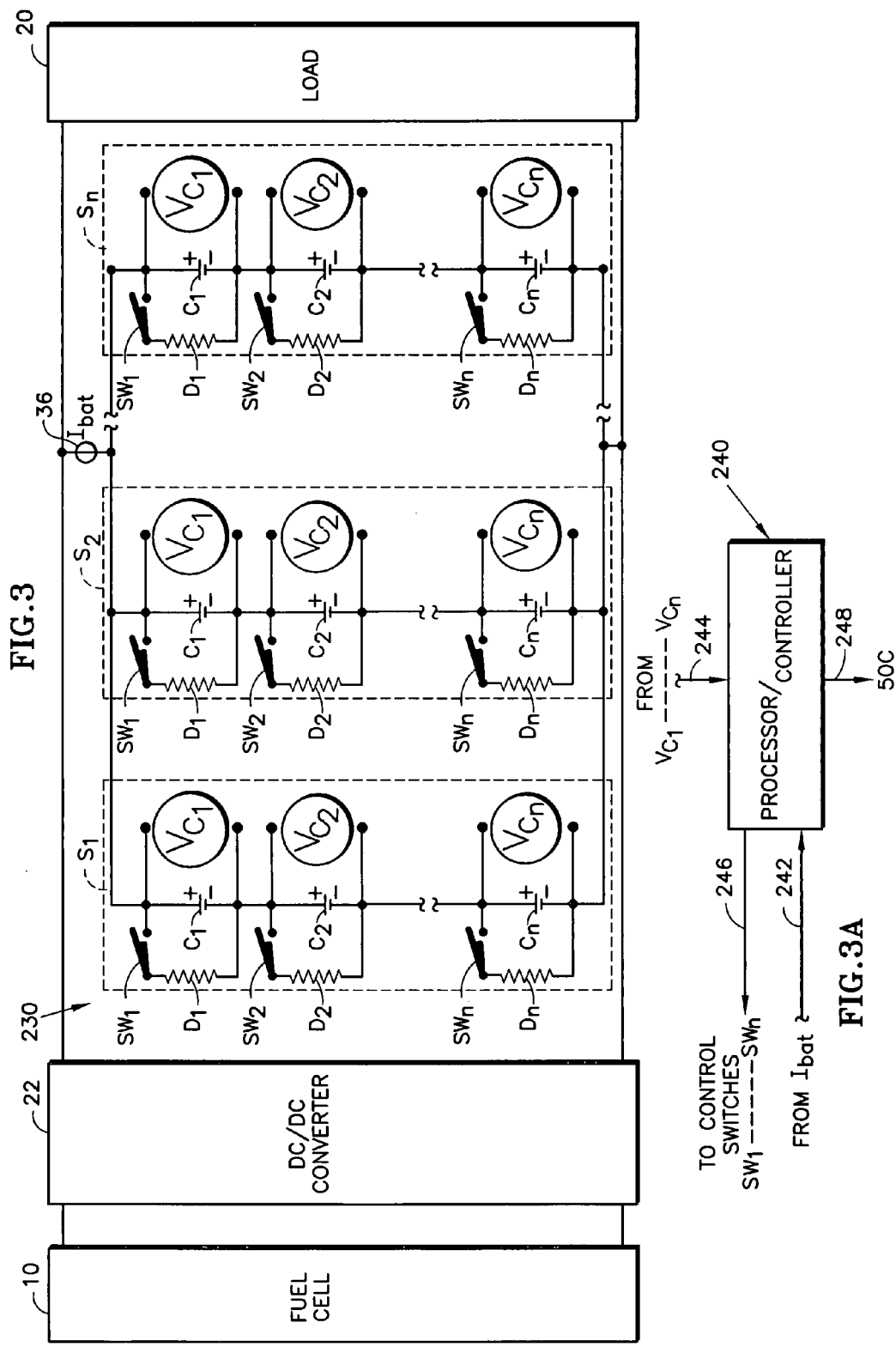
FIGS. 3 and 3A are, cumulatively, a schematic diagram illustrating an arrangement in accordance with the disclosure for indicating, with improved accuracy, the $I_{bat}$ current and/or the SOC, of a multi-celled energy storage system having cell-balancing capability, depicted in use in conjunction with a fuel cell.

Referring to FIGS. 3 and 3A cumulatively, reference numbers identical to those of FIGS. 1 and/or 2 are used in FIGS. 3 and 3A for those components that are the same, or substantially the same, in either of the two configurations. However, where there is some functional, compositional, or structural difference occasioned by the disclosure, but the components of FIGS. 3 and 3A nevertheless remain analogous to components in FIG. 1 or 2, they have been given the same reference number, but preceded by a "2". This brief description emphasizes the difference in character, structure, and/or function of the embodiment of FIGS. 3 and 3A, and minimizes repetition of description that is duplicative of that provided with respect to FIG. 1 or 2.

With reference to FIG. 3, as with respect to FIGS. 1 and 2, a primary electrical power source, such as fuel cell 10, is connected to load 20 via a DC/DC converter 22, and further includes an energy storage system, or battery, 230 intermediate the converter 22 and the load 20. The load 20 may of course comprise multiple discrete loads. As with the FIG. 2 embodiment, there is at least one serial string $S_1$ of multiple battery cells $C_1, C_2, \ldots C_n$ connected across (in parallel with) the output of converter 22, and typically multiple such strings $S_2, \ldots S_n$ mutually connected in parallel. Moreover, each of the battery cells $C_1, C_2, \ldots C_n$ has a dissipative device, such as respective resistors $D_1, D_2, \ldots D_n$, selectively connectable thereacross via respective selectively-actuable switches or relays $SW_1, SW_2, \ldots SW_n$ for the purpose of balancing cell voltages as may be required. The impedance or resistive value of each dissipative device is predetermined and remains constant. Moreover, it has been found satisfactory to make the value for each of those devices the same for the sake of simplicity and while that may introduce some variations in the balancing function, such variations are minor and deemed tolerable. In conjunction with that cell-balancing function, provision is made for sensing/measuring the voltage across each respective cell $C_1, C_2, \ldots C_n$, and, for simplicity of illustration in FIG. 3, is simply represented by the respective voltage-sensing ports or terminals $V_{c1}, V_{c2}, \ldots V_{cn}$.

The total current $I_{bat}$, either charging or discharging, flowing through a series string is sensed and measured by an appropriate meter or measuring device 36 to provide an indication of both the magnitude and direction (charge vs discharge) of the current. Assuming multiple series strings $S_1, S_2, \ldots S_n$ of battery cells connected in parallel, the current measuring device 36 is typically singular and connected to measure the summation of currents in all of the series strings $S_1, S_2, \ldots S_n$ in accordance with Kirchoff's law.

Referring to FIG. 3A, which should be considered as a connected adjunct of FIG. 3, a processor/controller 240 of appropriate and suitable capability, is configured/programmed to provide the requisite control and processing of the circuitry and functions herein described. The processor/controller 240 preferably includes a microcomputer having a CPU, clock, ROM, RAM and discrete I/O ports including D/A and A/D ports as required. For simplicity, the illustration of FIG. 3A depicts the only signal paths and control functions appearing externally of the processor/controller 240 as comprising a lead 242 designated "from $I_{bat}$", a lead 244 designated "from $V_{c1}, V_{c2} \ldots V_{cn}$", a lead 246 designated "control of switches $SW_1, SW_2, \ldots SW_n$", and a lead 248 designated "SOC", though it will be understood that other signal paths (not shown) may exist as well.

The lead 242 obtains the cumulative current signal $I_{bat}$ from meter or sensor 36. The lead 244, which may in fact be a multiplicity of leads or electrical connections but is here shown as one, provides connection between the processor 240 and the respective voltage ports $V_{c1}, V_{c2}, \ldots V_{cn}$ associated with each of the battery cells $C_1, C_2, \ldots C_n$ for monitoring the voltage across the respective cells. That function may typically be done via one or more high impedance amplifiers or other suitable voltage monitors. The lead 246, which may in fact be a multiplicity of leads or electrical connections but is here shown as one, is operative, in response to voltage measurements made across respective cells via lead 244, to selectively actuate respective ones of switches or relays $SW_1, SW_2, \ldots SW_n$ as appropriate. For instance, if the voltage $V_{C1}$ across a cell $C_1$ is a relatively robust 3 volts but the voltage across one or more other cells in the serial string, such as cell $C_2$, is a less robust 2.7 volts, the voltage across the cell having the higher voltage (e.g. cell $C_1$) is decreased by actuating the appropriate switch (e.g., $SW_1$) to place the dissipative device $D_1$ in parallel with the cell $C_1$. Since the series current is thus caused to divide or be apportioned between the cell $C_1$ and its dissipative resistor $D_1$, this now results in a smaller voltage across that cell $C_1$, thus bringing it more nearly to the voltage of the cell, or cells, having the somewhat lower voltage(s).

Beginning with the foregoing process of using dissipative devices to selectively decrease the voltage across selected ones of the battery cells, but by then further relying on a known or predetermined value of resistance of that dissipative device, coupled with knowledge of the voltage across that cell as determined at its voltage port (e.g., $V_{c1}$), it is then possible to determine the dissipative current flowing in resistor D1 by dividing the voltage by the resistance. In this way, it is possible to determine the dissipative current for each and all of the cells that have their switches closed and are drawing a dissipative current. This dissipative current is representative of a component of dissipative charge if that current is integrated over time. Accordingly, it is then possible to determine a net or corrected SOC by first determining a gross charge using the total $I_{bat}$ and subsequently correcting that gross charge by subtracting, as through arithmetic summation, or simply "summation", the total dissipative charge component determined by integration.

Alternatively, it is possible to simply correct the gross value of $I_{bat}$ by removing from it the entire dissipative component of current, as by summation, to yield a net $I_{bat}$ and then subsequently determining a correct SOC using that net $I_{bat}$.

Referring to FIG. 4, there is illustrated a simple flow chart representative of program steps executed by the processor/controller 240 of FIG. 3 for providing values of $I_{bat}$ current and/or SOC that is corrected, or compensated, for dissipative current. Block 310 represents the program routine which measures cell voltage $V_{c1}, V_{c2}, \ldots V_{cn}$ for each of the battery cells $C_1, C_2, \ldots C_n$ in each series string $S_1, S_2, \ldots S_n$ that contributed to the current flow $I_{bat}$ measured at sensor 36. As used in this diagram, the subscript notation "cell_i" refers to individual cells "i" in the sequence of cells from 1 to n. As a result of the determination of cell voltage at block 310, perhaps in an earlier iteration, the respective switch or switches for those cells having voltages greater than a threshold will be, or will have been, closed. Accordingly, dissipative currents will flow in those dissipative devices or resistances, and there is a commensurate determination of cell charge loss for each of those respective cells at block 320. The determination of cell charge loss utilizes a suitable algorithm to provide a measure of cell charge, $Q_{cell\_1}$, as being the $$\frac{1}{R}\int V_{cell\_i} \cdot dt,$$

where R is the predetermined, or known, resistance of the respective dissipative device $D_1 \ldots D_n$ and $V_{cell\_1}$ represents the measured voltage $V_{c1}, V_{c2}, \ldots V_{cn}$ of the corresponding respective cell. That voltage for each cell is integrated over time, and the resulting charge $Q_{cell\_i}$ is a function of current which is determined by V/R from Ohm's law. The cell charge loss for each of those cells for which respective switches are not closed is presumed to be zero. The function block 330 is simply a summation of the total cell charge losses for each of the cells for which energy was dissipated via a dissipative device, and appears as $$Q_{tot} = \sum_{i=1}^{n} Q_{cell\_i}.$$

This represents the total dissipative loss.

Correspondingly, block 340 represents the program routine which measures battery current $I_{bat}$ via sensor 36 for the total current flow through all of the serial strings, $S_1, S_2, \ldots S_n$ of cells, including any and all dissipative devices D for which the respective switches SW have been closed. Using that total measured battery current $I_{bat}$, the next block 350 computes the gross charge, $Q_{gross}$, as $Q_{gross} = \int I_{bat} \cdot dt$, where the total battery current is integrated over time.

At node 360, the total charge loss $Q_{tot}$ of block 330 is removed or subtracted from the gross charge $Q_{gross}$ of block 350 via the arithmetic summation of those two values. This then results in Q, or $Q_{net}$, which is the corrected state of charge (SOC) value for the battery 230.

Referring to FIG. 5, there is illustrated a simple flow chart representative of program steps executed by the processor/controller 240 of FIG. 3 for providing values $I_{batnet}$ of $I_{bat}$ current corrected, or compensated, for dissipative current. This is similar in most respects to the routine of FIG. 4, but rather than determining a dissipative charge loss and subtracting it from a gross charge value determined from uncorrected $I_{bat}$, this routine is simplified to initially provide a corrected $I_{bat}$ for the subsequent determination of a correct SOC. Reference numbers identical to those of FIG. 4 are used in FIG. 5 for those functions or routines that are the same, or substantially the same, in the two configurations. However, where there is some functional difference to a block of FIG. 5 which nevertheless remains analogous to a counterpart in FIG. 4, it has been given the same last two digits but preceded by a "4" rather than a "3". This brief description emphasizes the difference in character and/or function of the FIG. 5 embodiment, and minimizes repetition of description that is duplicative of that provided with respect to FIG. 4.

Function block 310 measures cell voltages, and function block 420 then determines from those measured cell voltages the respective dissipative currents, wherein $$I_{dis} = \frac{V}{R_D},$$

with V being the voltage across a respective cell having the dissipative resistance value $R_D$ connected in parallel therewith. The $I_{dis}$ for cells for which the respective switch is open, is zero, as previously. Then at block 430, all of the $I_{dis}$ values for the various cells for which the dissipative devices D are active are summed to provide a cumulative, or total, $I_{distot}$.

Correspondingly, block 340 represents the program routine which measures battery current $I_{bat}$ via sensor 36 for the total current flow through all of the serial strings, $S_1, S_2, \ldots S_n$ of cells, including any and all dissipative devices D for which the respective switches SW have been closed. That value $I_{bat}$ is the total uncorrected measure of current, and is arithmetically summed directly at node 460 with the value $I_{distot}$ from function block 430 to subtract or remove the latter from the former to yield a corrected $I_{bat}$, termed $I_{batnet}$. The value $I_{batnet}$ then is a corrected measure of the current substantially only through the battery cells themselves, and may be subsequently used as the corrected value of current, I, in a SOC algorithm that determines charge Q as an integral of current with respect to time.

Although the disclosure has been described and illustrated with respect to the exemplary embodiments thereof, it should be understood by those skilled in the art that the foregoing and various other changes, omissions and additions may be made without departing from the spirit and scope of the invention.

What is claimed is:

1. In a rechargeable energy storage system (230) characterized by a series arrangement ($S_1, S_2, \ldots S_n$) of multiple battery cells ($C_1, C_2, \ldots C_n$), multiple individual energy dissipative devices ($D_1, D_2, \ldots D_n$) each associated with and selectively connectable and disconnectable ($SW_1, SW_2, \ldots SW_n$) in parallel with a respective one of the multiple battery cells ($C_1, C_2, \ldots C_n$), circuitry (240, $V_{c1}, V_{c2}, \ldots V_{cn}$) for measuring the voltage ($V_{cell\_1}$) across each of the respective ones of the multiple battery cells ($C_1, C_2, \ldots C_n$), and circuitry (240, 36) for measuring the magnitude and direction of current ($I_{bat}$) flowing through the series arrangement of multiple battery cells and any dissipative devices connected in parallel therewith, a method of providing a measure of current flow ($I_{batnet}$) through substantially only the multiple battery cells comprising the steps of a) establishing a respective predetermined impedance (R) for each of the energy dissipative devices ($D_1, D_2, \ldots D_n$);

b) determining (240, 246, $SW_1, SW_2, \ldots SW_n$) which of the multiple individual energy dissipative devices ($D_1, D_2, \ldots D_n$) are actually connected in parallel with respective ones of said battery cells ($C_1, C_2, \ldots C_n$);

c) determining (240, 310, 244, $V_{c1}, V_{c2}, \ldots V_{cn}$) the voltage across each of said battery cells to which said energy dissipative devices are actually connected in parallel;

d) determining (240, 420) the current ($I_{dis}$) in said respective connected dissipative devices;

e) summing (240, 430) the said currents ($I_{dis}$) in the respective said connected dissipative devices to provide a measure ($I_{distot}$) of the total dissipated current; and f) subtracting (240, 460) the summed dissipated currents ($I_{distot}$) of the said connected dissipative devices from the current ($I_{bat}$) measured through the combined series arrangement of multiple battery cells and any energy dissipative devices connected in parallel therewith to provide a compensated measure of current ($I_{batnet}$) in substantially only the series arrangement of multiple battery cells.

2. The method of claim 1 wherein the respective predetermined impedance (R) for each of the energy dissipative devices ($D_1, D_2, \ldots D_n$) is the same, and the step of determining the current ($I_{dis}$) in each of said respective connected dissipative devices comprises dividing (240, 420) the voltage ($V_{cell\_1}$) for the respective battery cell by the impedance (R).

3. In a rechargeable energy storage system (230) characterized by a series arrangement ($S_1, S_2, \ldots S_n$) of multiple battery cells ($C_1, C_2, \ldots C_n$), multiple individual energy dissipative devices ($D_1, D_2, \ldots D_n$) each associated with and selectively connectable and disconnectable ($SW_1, SW_2, \ldots$ $SW_n$) in parallel with a respective one of the multiple battery cells ($C_1, C_2, \ldots C_n$), circuitry (240, $V_{c1}, V_{c2}, \ldots V_{cn}$) for measuring the voltage ($V_{cell\_i}$) across each of the respective ones of the multiple battery cells ($C_1, C_2, \ldots C_n$), and circuitry (240, 36) for measuring the magnitude and direction of current ($I_{bat}$) flowing through the series arrangement of multiple battery cells and any dissipative devices connected in parallel therewith, a method of providing a measure of net charge ($Q_{net}$) to substantially only the multiple battery cells comprising the steps of:

a) establishing a respective predetermined impedance (R) for each of the energy dissipative devices ($D_1, D_2, \ldots D_n$);

b) determining (240, 246, $SW_1, SW_2, \ldots SW_n$) which of the multiple individual energy dissipative devices ($D_1, D_2, \ldots D_n$) are actually connected in parallel with respective ones of said battery cells ($C_1, C_2, \ldots C_n$);

c) determining (240, 310, 244, $V_{c1}, V_{c2}, \ldots V_{cn}$) the voltage ($V_{cell\_i}$) across each of said battery cells to which said energy dissipative devices are actually connected in parallel;

d) determining (240, 320) the dissipative charge ($Q_{cell}$) dissipated in each of said connected dissipative devices;

e) summing (240, 330) the said dissipative charge ($Q_{cell}$) in the respective said connected dissipative devices to provide a measure ($Q_{tot}$) of the total charge dissipated;

f) from the measure of the magnitude and direction of current ($I_{bat}$) flowing through the series arrangement of multiple battery cells and any dissipative devices connected in parallel therewith, determining (240, 350) the gross charge ($Q_{gross}$); and g) subtracting (240, 360) the summed dissipated charges ($Q_{tot}$) of the said connected dissipative devices from the gross charge ($Q_{gross}$) determined for the combined series arrangement of multiple battery cells and any energy dissipative devices connected in parallel therewith to provide a compensated measure of charge ($Q_{net}$) for substantially only the series arrangement of multiple battery cells.

4. The method of claim 3 wherein the respective predetermined impedance (R) for each of the energy dissipative devices ($D_1, D_2, \ldots D_n$) is the same, and the step of determining the dissipative charge ($Q_{cell}$) dissipated in each of said respective connected dissipative devices comprises dividing (240, 320) the time integral of the respective battery cell voltage ($\int V_{cell\_i} \cdot dt$) by the impedance (R).

5. The method of claim 3 wherein the step (350) of determining the gross charge ($Q_{gross}$) comprises determining the time integral ($\int I_{bat} \cdot dt$) of the magnitude and direction of current ($I_{bat}$) flowing through the series arrangement of multiple battery cells and any dissipative devices connected in parallel therewith.

6. In a rechargeable energy storage system (230) characterized by a series arrangement ($S_1, S_2, \ldots S_n$) of multiple battery cells ($C_1, C_2, \ldots C_n$), multiple individual energy dissipative devices ($D_1, D_2, \ldots D_n$) each associated with and selectively connectable and disconnectable ($SW_1, SW_2, \ldots SW_n$) in parallel with a respective one of the multiple battery cells ($C_1, C_2, \ldots C_n$), circuitry (240, $V_{c1}, V_{c2}, \ldots V_{cn}$) for measuring the voltage ($V_{cell\_i}$) across each of the respective ones of the multiple battery cells ($C_1, C_2, \ldots C_n$), and circuitry (240, 36) for measuring the magnitude and direction of current ($I_{bat}$) flowing through the series arrangement of multiple battery cells and any dissipative devices connected in parallel therewith, the improvement comprising:

a) each of the energy dissipative devices ($D_1, D_2, \ldots D_n$) being a respective predetermined impedance (R);

b) circuitry (240, 246, $SW_1, SW_2, \ldots SW_n$) configured to determine which of the multiple individual energy dissipative devices ($D_1, D_2, \ldots D_n$) are actually connected in parallel with respective ones of said battery cells ($C_1, C_2, \ldots C_n$);

c) circuitry (240, 310, 244, $V_{c1}, V_{c2}, \ldots V_{cn}$) configured to determine the voltage across each of said battery cells to which said energy dissipative devices are actually connected in parallel;

d) circuitry (240, 420) configured to determine the current ($I_{dis}$) in said respective connected dissipative devices;

e) circuitry (240, 430) configured to sum the said currents ($I_{dis}$) in the respective said connected dissipative devices to provide a measure ($I_{distot}$) of the total dissipated current; and f) circuitry (240, 460) configured to subtract the summed dissipated currents ($I_{distot}$) of the said connected dissipative devices from the current ($I_{bat}$) measured through the combined series arrangement of multiple battery cells and any energy dissipative devices connected in parallel therewith and to thereby provide a compensated measure of current ($I_{batnet}$) in substantially only the series arrangement of multiple battery cells.

7. The rechargeable energy storage system (230) of claim 6 wherein each of said energy dissipative devices ($D_1, D_2, \ldots D_n$) is a resistance of equal value.

* * * * *